United States Patent
Lee et al.

(10) Patent No.: US 9,577,071 B2
(45) Date of Patent: Feb. 21, 2017

(54) METHOD OF MAKING A STRAINED STRUCTURE OF A SEMICONDUCTOR DEVICE

(71) Applicant: TAIWAN SEMICONDUCTOR MANUFACTURING COMPANY, LTD., Hsinchu (TW)

(72) Inventors: Tsung-Lin Lee, Hsinchu (TW); Chih Chieh Yeh, Taipei (TW); Feng Yuan, Yonghe (TW); Cheng-Yi Peng, Taipei (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/875,923

(22) Filed: Oct. 6, 2015

(65) Prior Publication Data
US 2016/0027897 A1 Jan. 28, 2016

Related U.S. Application Data

(62) Division of application No. 13/487,860, filed on Jun. 4, 2012, now Pat. No. 9,171,929.
(Continued)

(51) Int. Cl.
*H01L 29/78* (2006.01)
*H01L 21/02* (2006.01)
(Continued)

(52) U.S. Cl.
CPC ..... *H01L 29/66636* (2013.01); *H01L 21/0262* (2013.01); *H01L 21/02529* (2013.01); *H01L 21/02532* (2013.01); *H01L 21/02538* (2013.01); *H01L 21/823807* (2013.01); *H01L 21/823814* (2013.01); *H01L 21/823821* (2013.01);
(Continued)

(58) Field of Classification Search
CPC .......... H01L 21/02; H01L 21/20; H01L 29/78; H01L 29/00; H01L 29/20; H01L 29/775; H01L 29/1054; H01L 29/66636; H01L 29/66522; H01L 21/823807; H01L 21/28264; H01L 21/02255; H01L 21/0254; H01L 21/8238; H01L 29/10; H01L 29/66
(Continued)

(56) References Cited

U.S. PATENT DOCUMENTS

2006/0113603 A1* 6/2006 Currie ................. H01L 27/1203
257/368
2007/0196989 A1* 8/2007 Kim ................. H01L 21/823807
438/300

(Continued)

OTHER PUBLICATIONS

Office Action dated Mar. 3, 2015 from corresponding No. TW 102110435.

*Primary Examiner* — Chuong A Luu
(74) *Attorney, Agent, or Firm* — Haynes and Boone, LLP

(57) ABSTRACT

A method of fabricating a field effect transistor (FET) includes forming a channel portion over a first surface of a substrate, wherein the channel portion comprises germanium and defines a second surface above the first surface. The method further includes forming cavities that extend through the channel portion and into the substrate. The method further includes epitaxially-growing a strained material in the cavities, wherein the strained material comprises SiGe, Ge, Si, SiC, GeSn, SiGeSn, SiSn or a III-V material.

20 Claims, 12 Drawing Sheets

Related U.S. Application Data

(60) Provisional application No. 61/638,175, filed on Apr. 25, 2012.

(51) Int. Cl.
  *H01L 29/66* (2006.01)
  *H01L 29/10* (2006.01)
  *H01L 29/165* (2006.01)
  *H01L 21/8238* (2006.01)
  *H01L 27/092* (2006.01)

(52) U.S. Cl.
  CPC .. *H01L 21/823878* (2013.01); *H01L 27/0924* (2013.01); *H01L 29/1054* (2013.01); *H01L 29/165* (2013.01); *H01L 29/66651* (2013.01); *H01L 29/7848* (2013.01)

(58) Field of Classification Search
  USPC .............. 438/285, 478, 294, 197, 199, 590
  See application file for complete search history.

(56) References Cited

U.S. PATENT DOCUMENTS

| | | |
|---|---|---|
| 2007/0281411 A1* | 12/2007 | Murthy ............... H01L 21/324 438/197 |
| 2009/0065853 A1 | 3/2009 | Hanafi |
| 2010/0006983 A1 | 1/2010 | Gutsche et al. |
| 2010/0224938 A1 | 9/2010 | Zhu |
| 2010/0252862 A1 | 10/2010 | Ko et al. |
| 2011/0068407 A1 | 3/2011 | Yeh et al. |
| 2011/0079829 A1 | 4/2011 | Lai et al. |
| 2011/0183481 A1* | 7/2011 | Dyer ................ H01L 21/30608 438/198 |
| 2011/0248348 A1 | 10/2011 | Gan et al. |
| 2011/0291163 A1* | 12/2011 | Kronholz ........ H01L 21/823807 257/288 |
| 2012/0091506 A1 | 4/2012 | Rim et al. |

\* cited by examiner

METHOD OF MAKING A STRAINED STRUCTURE OF A SEMICONDUCTOR DEVICE

PRIORITY CLAIM

The present application is a divisional of U.S. application Ser. No. 13/487,860, filed Jun. 4, 2012 now U.S. Pat. No. 9,171,929, which claims priority of U.S. Provisional Application No. 61/638,175, filed Apr. 25, 2012, which are incorporated herein by reference in their entireties.

TECHNICAL FIELD

This disclosure relates to integrated circuit fabrication and, more particularly, to a semiconductor device with a strained structure.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. In addition, strained structures in source and drain (S/D) recess cavities of the MOSFET utilizing selectively grown silicon germanium (SiGe) may be used to enhance carrier mobility.

However, there are challenges to implement such features and processes in complementary metal-oxide-semiconductor (CMOS) fabrication. For example, it is difficult to achieve enhanced carrier mobility for a field-effect transistor (FET) because strained materials can not deliver a given amount of strain into channel region of the FET, thereby increasing the likelihood of device instability and/or device failure. As the gate length and spacing between devices decrease, these problems are exacerbated.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
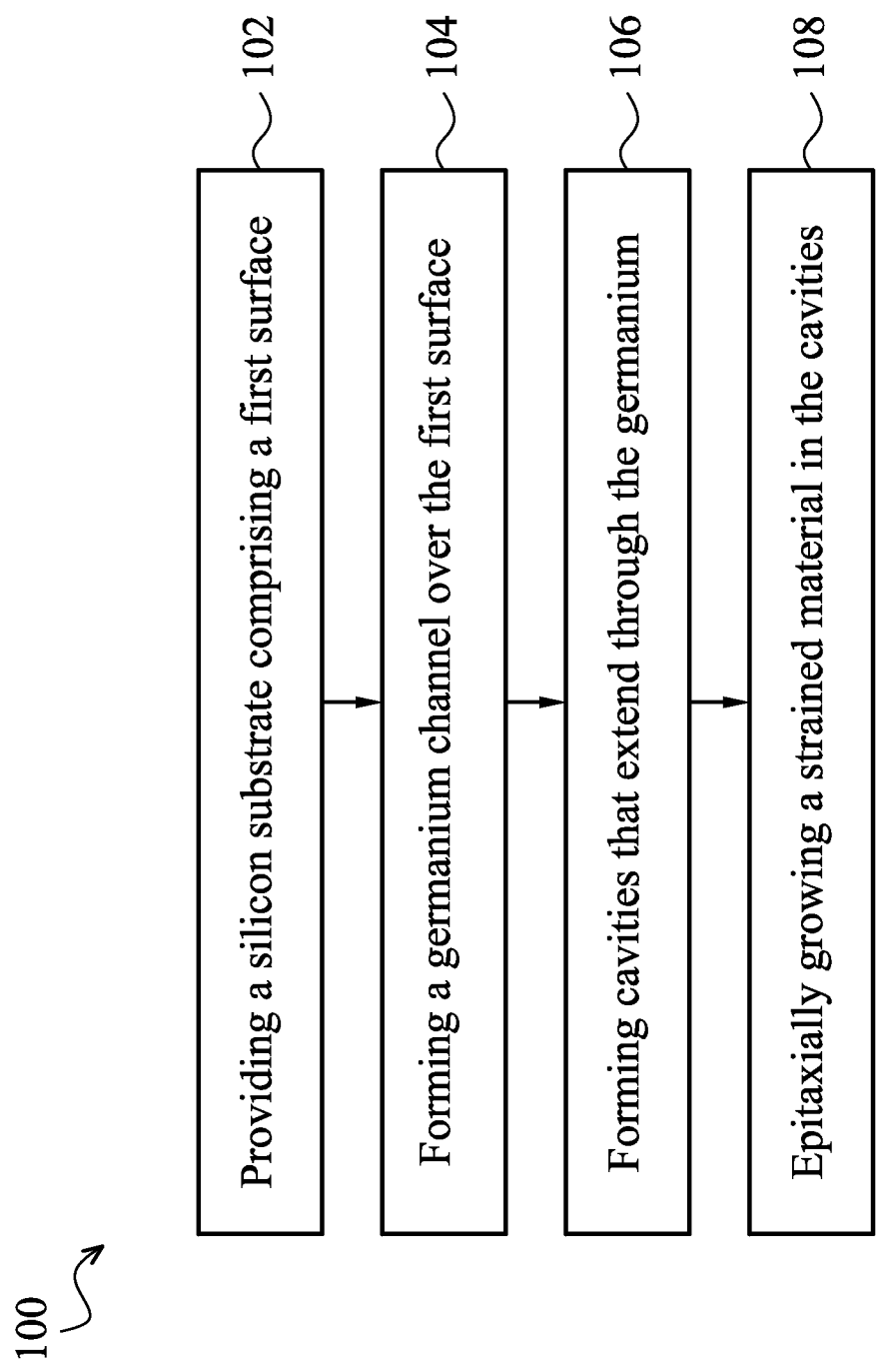
FIG. 1 is a flowchart of a method of fabricating a strained structure of a semiconductor device according to various aspects of the present disclosure.

It is understood that the following disclosure provides many different embodiments, or examples, for implementing different features of the invention. Specific examples of components and arrangements are described below to simplify the present disclosure. These are, of course, examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 of fabricating a strained structure of a semiconductor device according to various aspects of the present disclosure. The method 100 begins with step 102 in which a silicon substrate comprising a first surface is provided. The method 100 continues with step 104 in which a germanium channel is formed over the first surface. The method 100 continues with step 106 in which a cavity is formed that extends through the germanium channel and into the silicon substrate. The method 100 continues with step 108 in which a strained material is epitaxially-grown in the cavity. The discussion that follows illustrates embodiments of semiconductor devices that can be fabricated according to the method 100 of FIG. 1.

FIGS. 2A-2G are schematic cross-sectional views of an example semiconductor device 200 comprising a strained structure 230a at various stages of fabrication according to various aspects of the present disclosure. FIGS. 3A-3D are schematic cross-sectional views of another example semiconductor device 300 comprising a strained structure 330a at various stages of fabrication according to various aspects of the present disclosure. As employed in the present disclosure, the term semiconductor devices 200, 300 refer to a fin field effect transistor (FinFET). The FinFET refers to any fin-based, multi-gate transistor. In some alternative embodiments, the term semiconductor devices 200, 300 refer to a planar field effect transistor (FET). The semiconductor devices 200, 300 may be included in a microprocessor, memory cell, and/or other integrated circuit (IC). It is noted that the method of FIG. 1 does not produce a completed semiconductor devices 200, 300. Completed semiconductor devices 200, 300 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 2A through 3D are simplified for a better understanding of the concepts of the present disclosure. For example, although only the semiconductor devices 200, 300 are depicted in FIGS. 2A-3D, it is understood the IC may comprise a number of other devices comprising resistors, capacitors, inductors, fuses, etc.

Figure 2A:
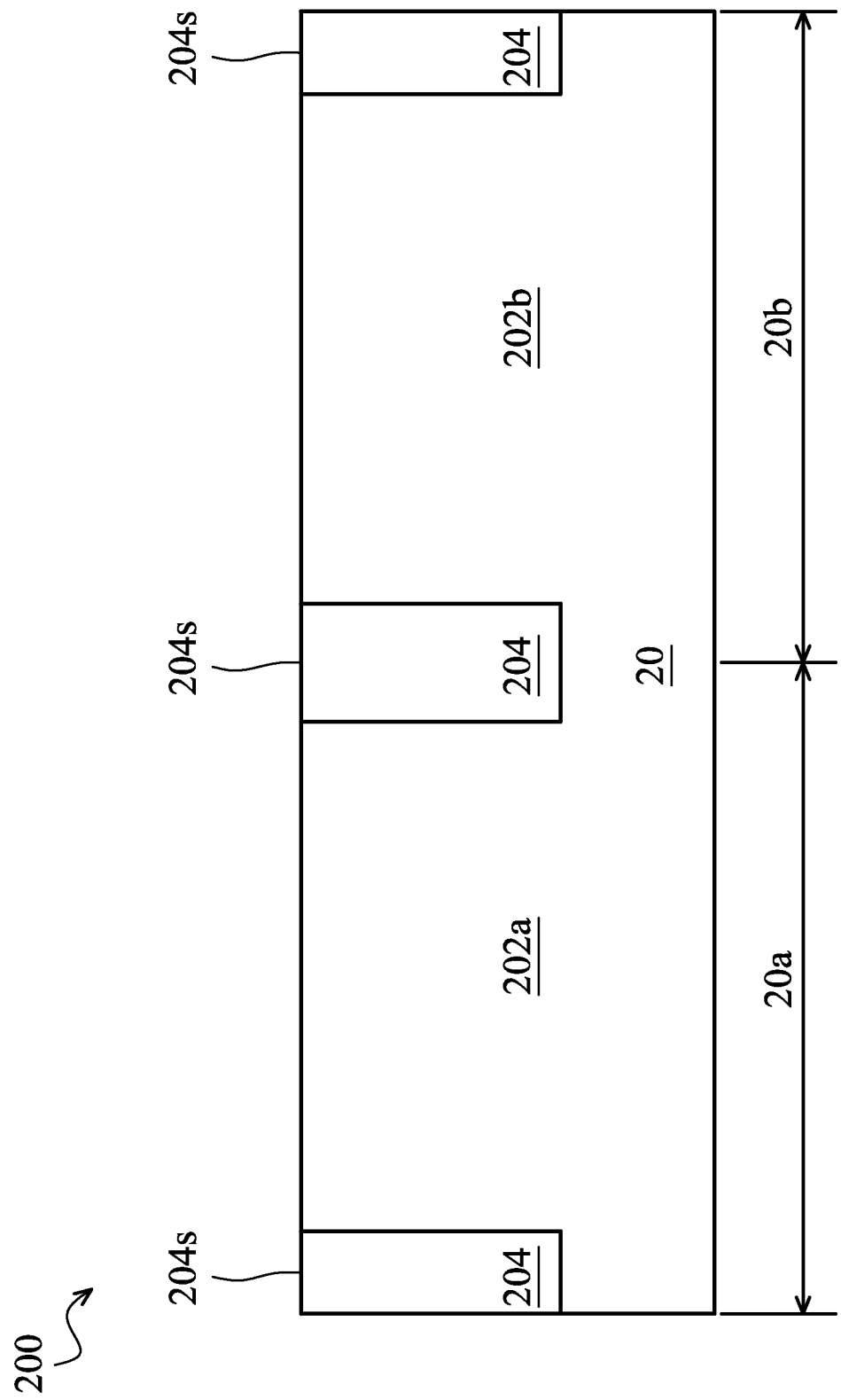
FIGS. 2A-2G are schematic cross-sectional views of an example semiconductor device comprising a strained structure at various stages of fabrication according to various aspects of the present disclosure.

Referring to FIG. 2A and step 102 in FIG. 1, a substrate 20 is provided. In one embodiment, the substrate 20 comprises a crystalline silicon substrate (e.g., wafer). In an alternative embodiment, the substrate 20 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 20 may include an epitaxial layer (epi-layer), may be strained for performance enhancement, and/or may include a silicon-on-insulator (SOI) structure. The substrate 20 may comprise various doped regions depending on design requirements (e.g., p-type substrate or n-type substrate). In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be usable for forming an n-type field effect transistor (FET), or alternatively for forming a p-type FET.

In the depicted embodiment, the substrate 20 comprises a first region 20a and a second region 20b. In one embodiment for the semiconductor device 200, the first region 20a refers to a core region where core devices would be formed. The second region 20b refers to a peripheral region where input/output (I/O) devices would be formed. In some embodiments, both the core devices and I/O devices are p-type FETs. In some embodiments, both the core devices and I/O devices are n-type FETs. In an alternative embodiment for the semiconductor device 300, the first region 20a refers to a first core region where first core devices would be formed. The second region 20b refers to a second core region where second core devices would be formed. In the depicted embodiment, the first core devices are p-type FETs, while the second core devices are n-type FETs. In yet another alternative embodiment for the semiconductor device 300, the first region 20a refers to a first core region where first core devices would be formed. The second region 20b refers to a peripheral region where I/O devices would be formed. In the depicted embodiment, the first core devices are p-type FETs, while the I/O devices are n-type FETs.

In an embodiment for forming FinFETs, the substrate 20 comprises a first fin structure 202a in the first region 20a and a second fin structure 202b in the second region 20b. Each of the first fin structure 202a and second fin structure 202b, formed on the substrate 20, comprises one or more fins. In the depicted embodiment, for simplicity, each of the first fin structure 202a and second fin structure 202b comprises a single fin.

The first and second fin structures 202a, 202b are formed using any suitable process comprising various deposition, photolithography and/or etching processes. An exemplary photolithography process may include forming a photoresist layer (resist) overlying the substrate 20 (e.g., on a silicon layer), exposing the resist to a pattern, performing a post-exposure bake process, and developing the resist to form a masking element including the resist. The silicon layer may then be etched using reactive ion etching (RIE) processes and/or other suitable processes. In an example, silicon fins of the first and second fin structures 202a, 202b may be formed using patterning and etching a portion of the silicon substrate 20. In another example, silicon fins of the first and second fin structures 202a, 202b may be formed using patterning and etching a silicon layer deposited overlying an insulator layer (for example, an upper silicon layer of a silicon-insulator-silicon stack of an SOI substrate).

In the depicted embodiment, isolation regions are formed within the substrate 20 to define and electrically isolate the first and second fin structures 202a, 202b. In one example, the isolation regions include a shallow trench isolation (STI) 204 regions. The isolation regions may comprise silicon oxide, silicon nitride, silicon oxynitride, fluoride-doped silicate glass (FSG), a low-K dielectric material, and/or combinations thereof. The isolation regions, and in the present embodiment, the STI 204 regions, may be formed by any suitable process. As one example, the formation of the STI 204 regions may include filling trenches between the first and second fin structures 202a, 202b (for example, using a chemical vapor deposition process) with a dielectric material. In some embodiments, the filled trench may have a multi-layer structure such as a thermal oxide liner layer filled with silicon nitride or silicon oxide. In the depicted embodiment, the STI 204 regions comprise STI surfaces 204s.

Figure 2B:
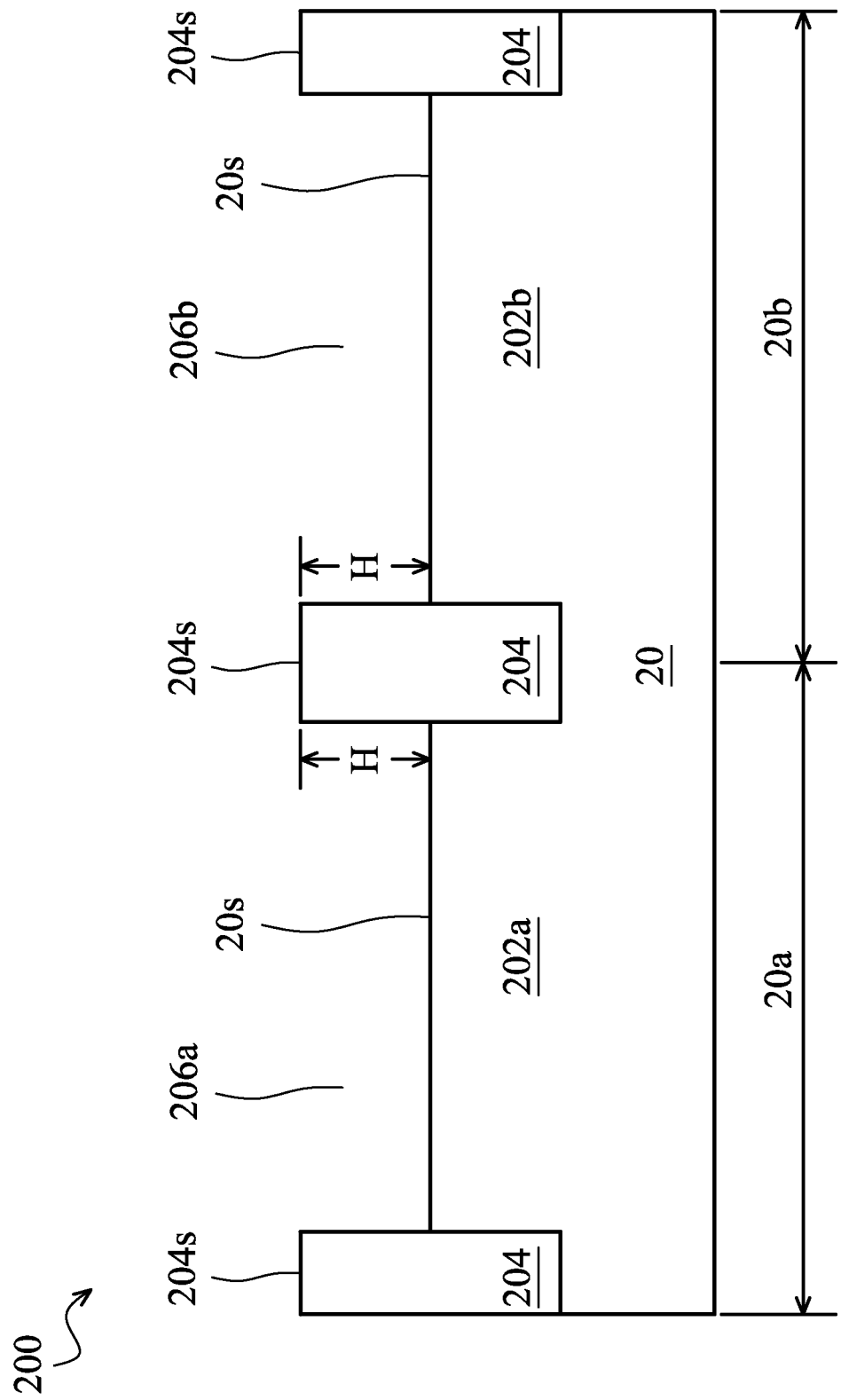

Referring to FIG. 2B and step 102 in FIG. 1, upper portion of the first fin structure 202a is recessed to form first trench 206a below the STI surfaces 204s, while upper portion of the second fin structure 202b is recessed to form second trench 206b below the STI surfaces 204s. In the present embodiment, each of exposed surfaces of lower portions of the first and second fin structures 202a, 202b defines a first surface 20s. In an exemplary embodiment, a height H of the first and second trenches 206a, 206b may range from about 20 nm to about 70 nm. One skilled in the art will realize, however, that the dimensions and values recited throughout the descriptions are merely examples, and may be changed to suit different scales of ICs.

In the depicted embodiment, using the STI 204 regions as a hard mask, a biased etching process is performed to recess the first fin structure 202a to form the first trench 206a and the second fin structure 202b to form the second trench 206b. In one embodiment, the etching process may be performed under a pressure of about 1 mTorr to 1000 mTorr, a power of about 50 W to 1000 W, a bias voltage of about 20 V to 500 V, at a temperature of about 40° C. to 60° C., using a HBr and/or $Cl_2$ as etch gases. Also, in some embodiments, the bias voltage used in the etching process may be tuned to allow better control of an etching direction to achieve predetermined profiles for the trenches 206a, 206b.

Figure 2C:
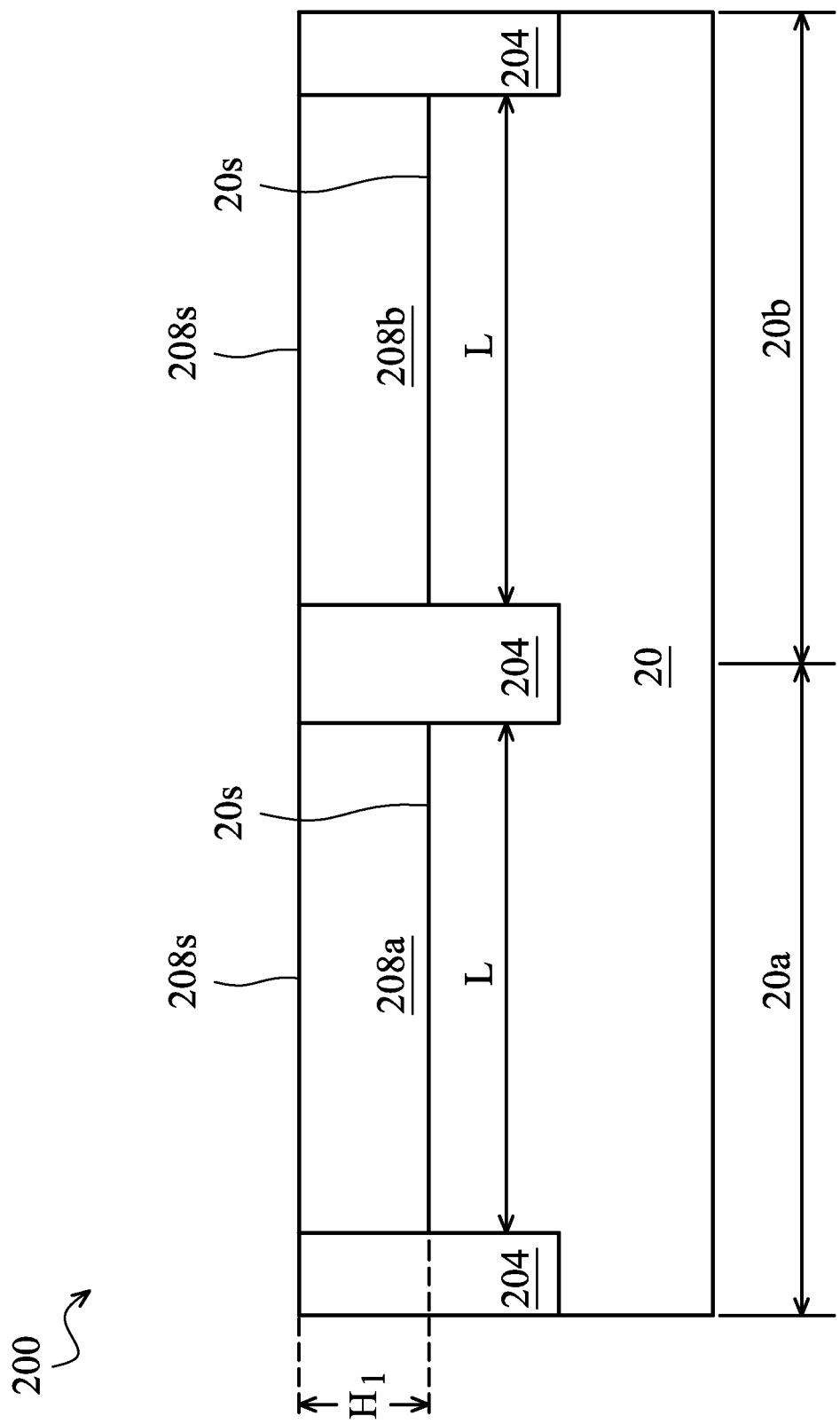

The method 100 continues with step 104 in which the structure in FIG. 2C is produced by forming a first germanium channel 208a and a second germanium channel 208b over the first surface 20s, wherein each of the first germanium channel 208a and the second germanium channel 208b has a second surface 208s at a first height $H_1$ above the first surface 20s, and a length L parallel to first surface 20s.

When choosing a semiconductor material for forming a channel region, considerations include the properties of the semiconductor material such as junction forward voltage, mobility of electron and hole, leakage current level, and quality of interface between the semiconductor material and other materials, such as oxide materials. Germanium (Ge) has higher electron mobility than Si. Accordingly, in the depicted embodiment, a channel region of the semiconductor device 200 is Ge. In some embodiments, the semiconductor material for forming the channel region comprises a material other than germanium, such as gallium arsenide, silicon carbide, indium arsenide, or indium phosphide; or a suitable alloy semiconductor, such as silicon germanium carbide, gallium arsenic phosphide, or gallium indium phosphide.

In one embodiment, the Ge epitaxial process may be performed under a pressure of about 10 mTorr to 100 mTorr, at a temperature of about 350° C. to 450° C., using $GeH_4$, $GeH_3CH_3$, and/or $(GeH_3)_2CH_2$ as epitaxial gases. Optionally, an anneal process after the epitaxial process is performed at a temperature of about 550° C. to 750° C. to confine dislocation defects on the interface of the Si and Ge epitaxial layer. In an embodiment for forming planar FETs (not shown), the portion of the STI 204 remains due to only surface channel needed. In an embodiment for forming FinFETs, a portion of the STI 204 regions is removed by HF solution to expose the Ge epitaxial layer (shown in FIG. 2D), acting as germanium channels of the semiconductor devices 200, 300.

Figure 2D:
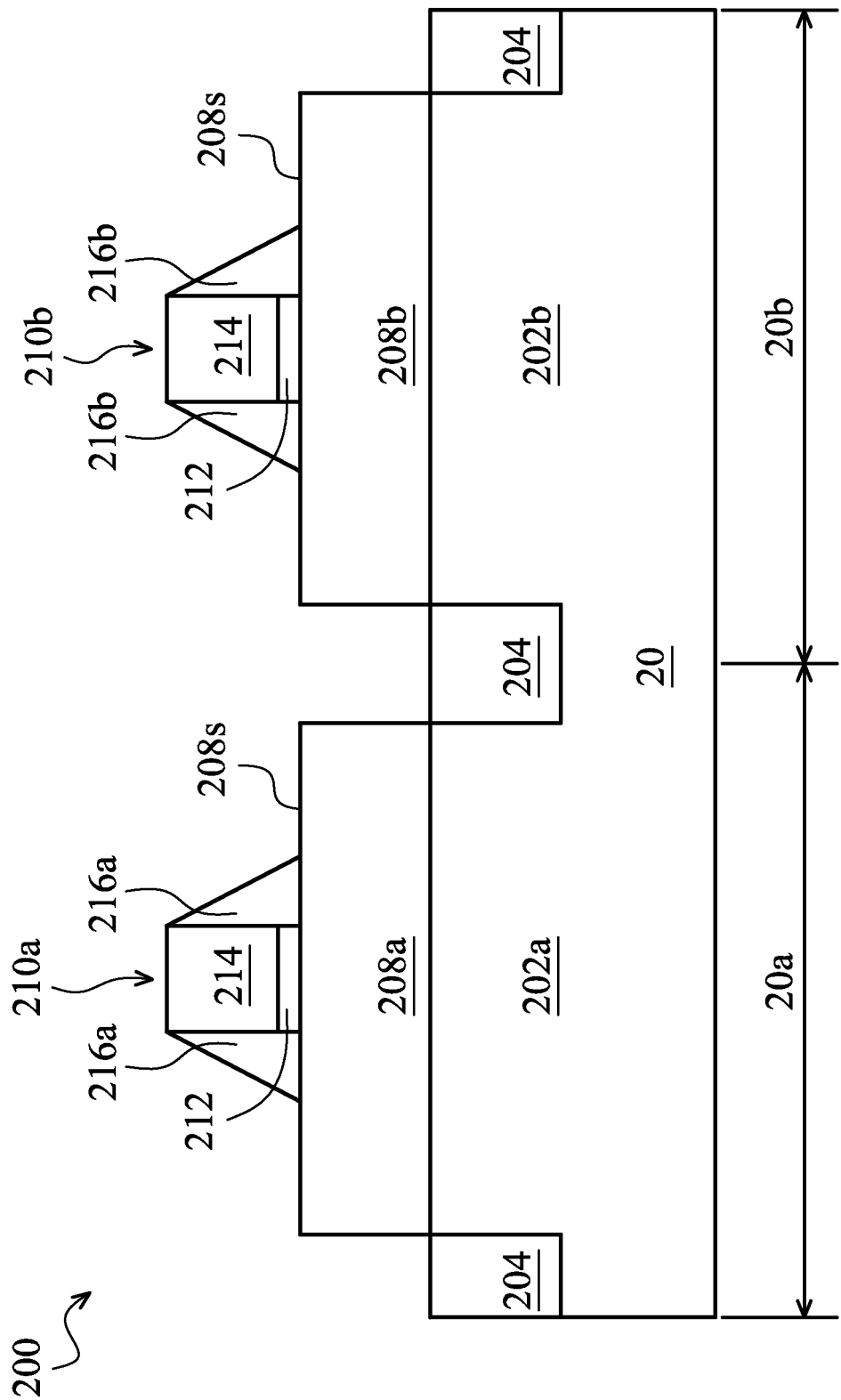

Referring to FIG. 2D, subsequent to the formation of the first and second germanium channels 208a, 208b over the first surface 20s, a first gate stack 210a is formed on the second surface 208s of the first germanium channels 208a, while a second gate stack 210b is formed on the second surface 208s of the second germanium channels 208b. In the depicted embodiment, each of the first and second gate stacks 210a, 210b comprises a gate dielectric layer 212 and a gate electrode layer 214. The first and second gate stacks 210a, 210b may be formed using any suitable process, including the processes described herein.

In one example, the gate dielectric layer 212 and gate electrode layer 214 are sequentially deposited over the substrate 20. In some embodiments, the gate dielectric layer 212 may include silicon oxide, silicon nitride, silicon oxy-nitride, or high-k dielectric. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In the present embodiment, the gate dielectric layer 212 is a high-k dielectric layer with a thickness in the range of about 10 to 30 angstroms. The gate dielectric layer 212 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 212 may further comprise an interfacial layer (not shown) to reduce damage between the gate dielectric layer 212 and the fin structures 202a and 202b. The interfacial layer may comprise silicon oxide.

In some embodiments, the gate electrode layer 214 may comprise a single layer or multilayer structure. In the present embodiment, the gate electrode layer 214 may comprise poly-silicon. Further, the gate electrode layer 214 may be doped poly-silicon with the uniform or non-uniform doping. In some alternative embodiments, the gate electrode layer 214 may include a metal such as Al, Cu, W, Ti, Ta, TiN, TiAl, TiAlN, TaN, NiSi, CoSi, other conductive materials with a work function compatible with the substrate material, or combinations thereof. In the present embodiment, the gate electrode layer 214 has a thickness in the range of about 30 nm to about 60 nm. The gate electrode layer 214 may be formed using a suitable process such as ALD, CVD, PVD, plating, or combinations thereof.

Then, a layer of photoresist (not shown) is formed over the gate electrode layer 214 by a suitable process, such as spin-on coating, and patterned to form a patterned photoresist feature by a proper lithography patterning method. In at least one embodiment, a width of the patterned photoresist feature is in the range of about 5 to 45 nm. The patterned photoresist feature can then be transferred using a dry etching process to the underlying layers (i.e., the gate electrode layer 214 and the gate dielectric layer 212) to form the first and second gate stacks 210a, 210b. The photoresist layer may be stripped thereafter.

In another example, a hard mask layer (not shown) is formed over the gate electrode layer 214; a patterned photoresist layer (not shown) is formed on the hard mask layer; the pattern of the photoresist layer is transferred to the hard mask layer and then transferred to the gate electrode layer 214 and the gate dielectric layer 212 to form the first and second gate stacks 210a, 210b. The hard mask layer comprises silicon oxide. In some alternative embodiments, the hard mask layer may optionally comprise silicon nitride, silicon oxynitride, and/or other suitable dielectric materials, and may be formed using a method such as CVD or PVD. The hard mask layer has a thickness in the range from about 100 to 800 angstroms. The photoresist layer may be stripped thereafter.

Still referring to FIG. 2D, the semiconductor device 200 further comprises a pair of sidewall spacers 216a on two sides of the first gate stack 210a and a pair of sidewall spacers 216b on two sides of the second gate stack 210b. In some embodiments, the sidewall spacers 216a are formed by first forming a dielectric layer over the first and second gate stacks 210a, 210b. The dielectric layer may include silicon oxide, silicon nitride, silicon oxy-nitride, or other suitable material. The dielectric layer may comprise a single layer or multilayer structure. The dielectric layer may be formed by CVD, PVD, ALD, or other suitable technique. The dielectric layer has a thickness ranging from about 5 to 15 nm. Then, an anisotropic etching is performed on the dielectric layer to form the pair of sidewall spacers 216a on two sides of the first gate stack 210a and the pair of sidewall spacers 216b on two sides of the second gate stack 210b.

Figure 2E:
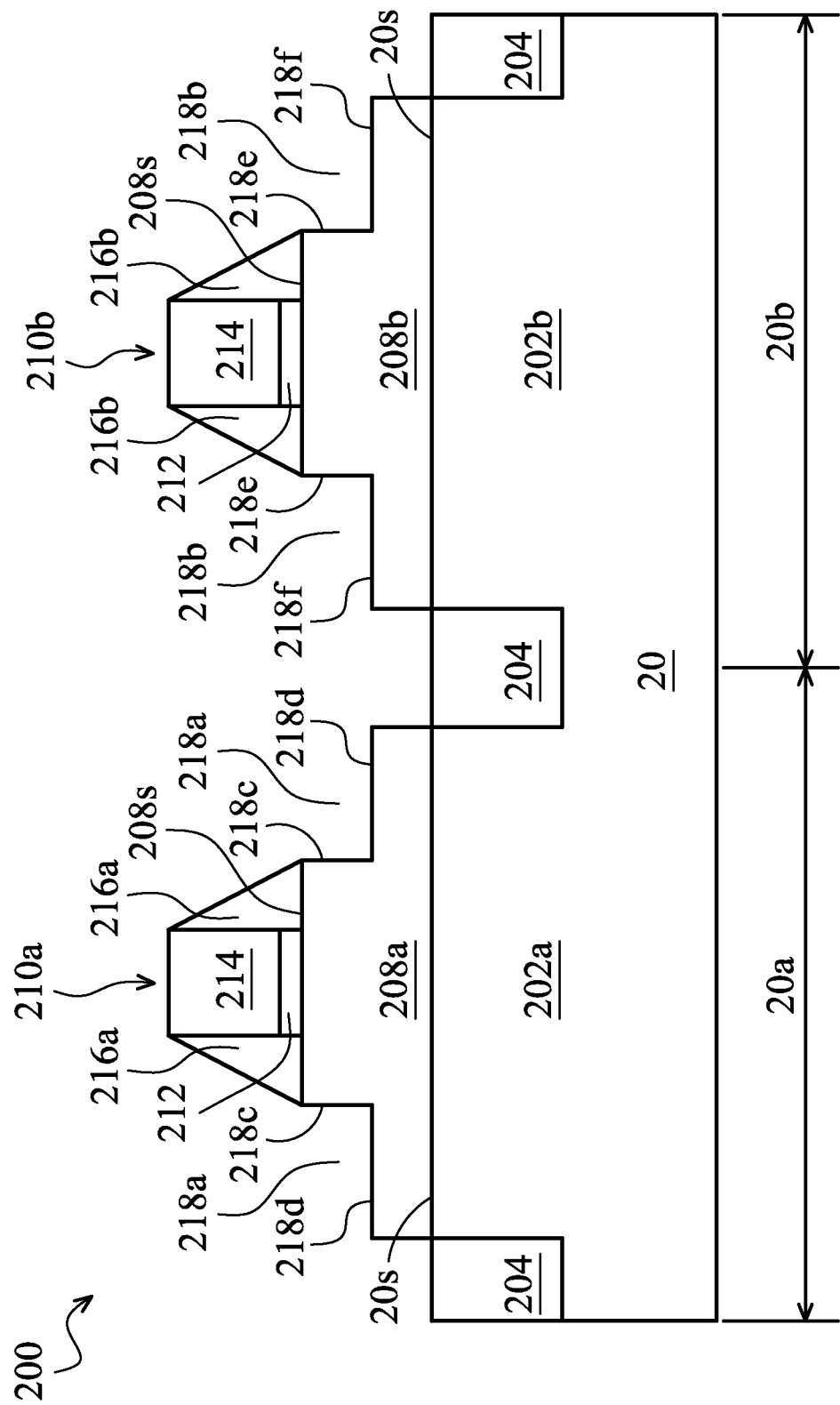

Referring to FIG. 2E, after the formation of the first and second gate stacks 210a, 210b, portions of the first and second germanium channels 208a, 208b (other than where the first and second gate stacks 210a, 210b and sidewall spacers 216a, 216b are formed thereover) are recessed to form first source and drain (S/D) cavities 218a in the first germanium channels 208a and second S/D cavities 218b in the second germanium channels 208b. Both the first and second S/D cavities 218a, 218b are between the first surface 20s and second surface 208s. In the depicted embodiment, the first S/D cavities 218a are adjacent to the first gate stack 210a, while the second S/D cavities 218b are adjacent to the second gate stack 210b, wherein each first S/D cavities 218a formed by the first germanium channel 208a comprises one sidewall 218c and a bottom surface 218d, wherein each second S/D cavities 218b formed by the second germanium channel 208b comprises one sidewall 218e and a bottom surface 218f. In an alternative embodiment, the germanium channels 208a, 208b are not all recessed as depicted in FIG. 2E.

In the depicted embodiment, using the pairs of sidewall spacers 216a, 216b as hard masks, a biased etching process is performed to recess at least a portion of the second surface 208s of the first and second germanium channels 208a, 208b that are unprotected or exposed to form the first and second S/D cavities 218a, 218b. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$.

The process steps up to this point have provided the first and second S/D cavities 218a, 218b between the first surface 20s and second surface 208s. In some configurations, using a metal-organic chemical vapor deposition (MOCVD) process, a strained material such as a gallium arsenide (GaAs) is selectively grown in the first cavities 218a of the first germanium channels 208a along the sidewall 208c and the bottom surface 208d. However, the growing process of the strained material is not well-controlled using the MOCVD process.

Therefore, using MOCVD creates a non-uniform distribution of strained material in the cavities 218a. Since the lattice constant of the strained material is different from the first germanium channels 208a, the channel region of a semiconductor device is strained or stressed to enhance carrier mobility of the device. However, the non-uniform distribution of strained materials in the cavities 218a causes non-uniformity of strains applied to the channel region of the semiconductor device. Thus, the strained material may not deliver a given amount of strain into channel region of the semiconductor device, resulting in an insufficient on-current of the semiconductor device.

Accordingly, the processing discussed below with reference to FIGS. 2F-2G and 3A-3D may form cavities that extend through the germanium channel and into the silicon substrate. The cavities are filled with a strained structure comprising a SiGe layer. The strained structure may decrease non-uniform distribution of strained material, thereby delivering a given amount of strain into channel region of the semiconductor device. Problems associated with insufficient on-current of a semiconductor device may be avoided, thereby enhancing the device performance.

Figure 2F:
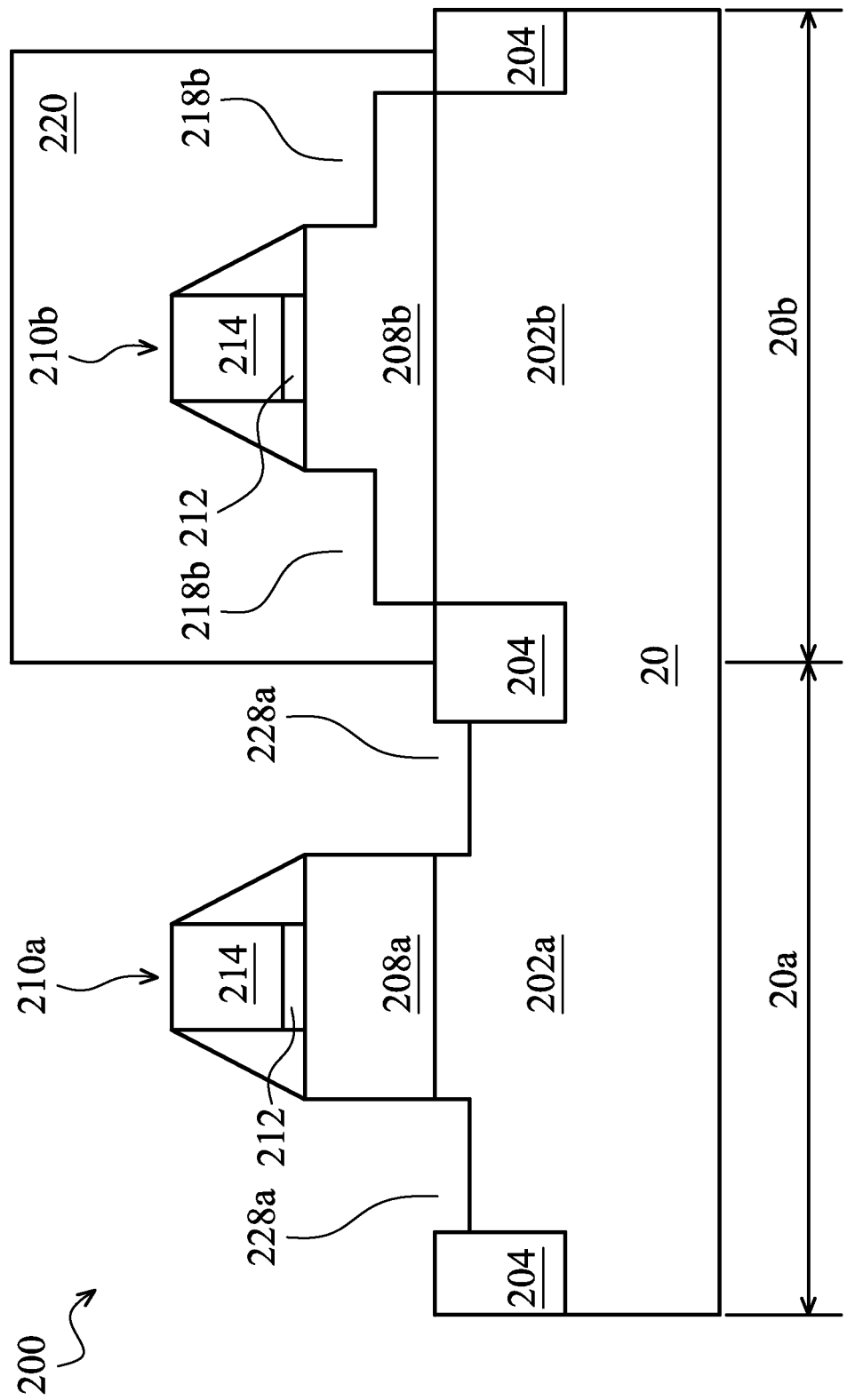

For fabricating one embodiment of a strained structure 230 (shown in FIG. 2G) of the semiconductor device 200, the structure in FIG. 2F is produced by a deep-cavity patterning process (step 106 in FIG. 1). The deep-cavity patterning process may be accomplished by forming a photo-sensitive layer 220 over the substrate 20. The photo-sensitive layer 220 is then patterned to expose the first S/D cavities 218a of the first germanium channel 208a, while cover the second S/D cavities 218b of the second germanium channel 208b.

In the depicted embodiment, using the patterned photo-sensitive layer 220, first gate stack 210a, and STI 204 regions as masks, the exposed first S/D cavities 218a of the first germanium channel 208a are further etched to form third cavities 228a that extend through the first germanium channel 208a and into the silicon substrate 20. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$. The patterned photo-sensitive layer 220 may be stripped thereafter to expose the second S/D cavities 218b of the second germanium channel 208b.

Figure 2G:
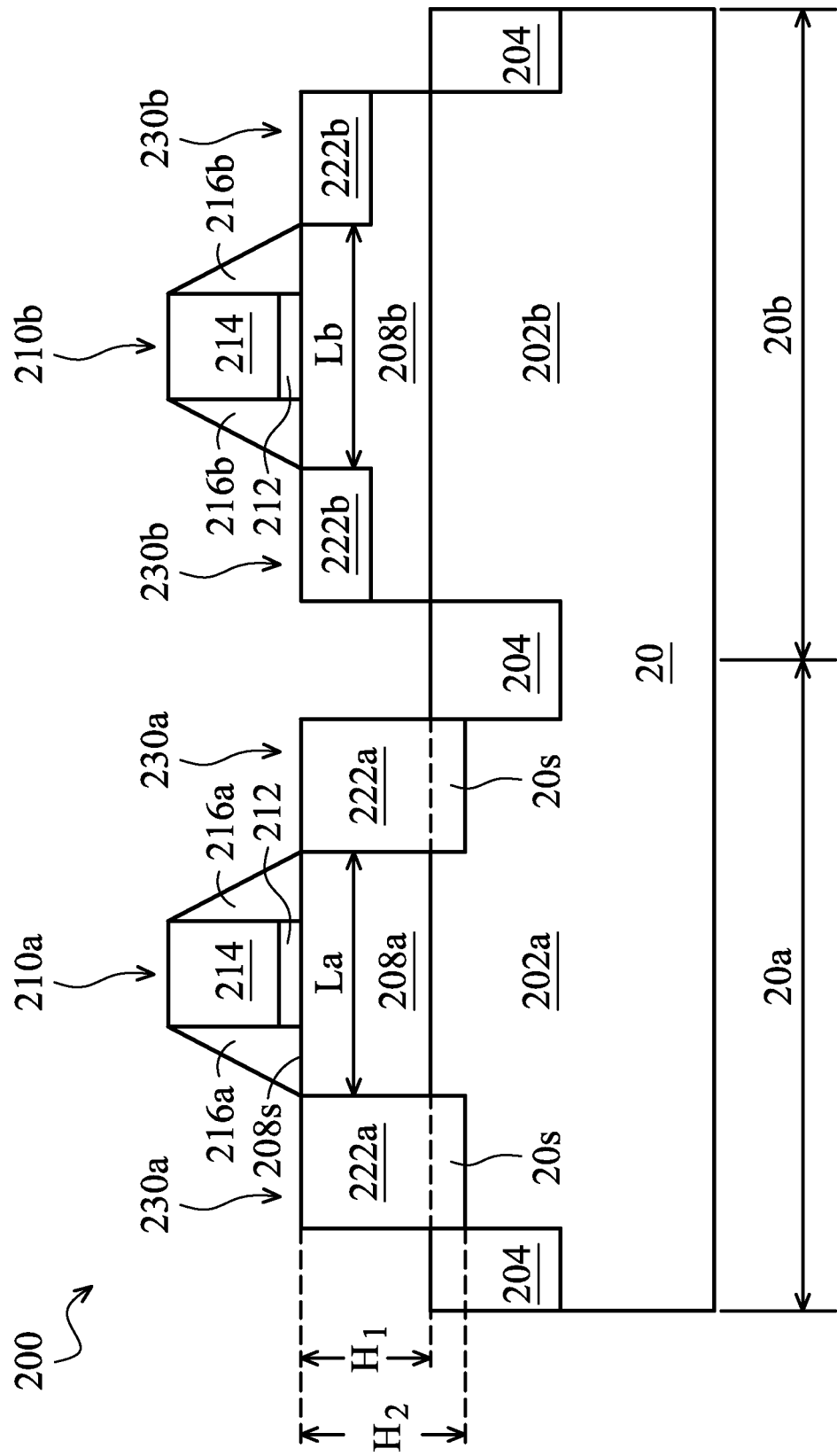

Referring to FIG. 2G and step 108 in FIG. 1, after formation of the third cavities 228a that extend through the first germanium channel 208a and into the silicon substrate 20, the structure in FIG. 2G is produced by epitaxially-growing a strained material in the second S/D cavities 218b to form S/D regions 222b and third S/D cavities 228a to form S/D regions 222a. The strained material may comprises SiGe, Ge, Si, SiC, GeSn, SiGeSn, SiSn, or III-V material.

In the depicted embodiment, a pre-cleaning process may be performed to clean the second and third S/D cavities 218b, 228a with HF or other suitable solution. Then, the strained material such as silicon germanium (SiGe) is selectively grown by an LPCVD process to fill the second and third S/D cavities 218b, 228a. In the depicted embodiment, the LPCVD process is performed at a temperature of about 660 to 700° C. and under a pressure of about 13 to 50 Torr, using $SiH_2Cl_2$, HCl, $GeH_4$, $B_2H_6$, and $H_2$ as reaction gases. A ratio of a mass flow rate of the $SiH_2Cl_2$ to a mass flow rate of the HCl is in the range of about 0.8 to 1.5, while a ratio of a mass flow rate of the $SiH_2Cl_2$ to a mass flow rate of the $GeH_4$ is in the range of about 10 to 50.

In the first region 20a (or refers to a core region), two S/D regions 222a are formed on the first surface 20s (dotted line) and sandwiching an upper portion of the first germanium channel 208a having a length $L_a$ of the channel 208a. In some embodiments, the two S/D regions 222a extending downward from the second surface 208s is coplanar with the first surface 20s (dotted line). In some embodiments, the two S/D regions 222a extending downward from the second surface 208s is lower than the first surface 20s. As such, a portion of the two S/D regions 222a extending downward from the second surface 208s has a second height $H_2$ equal to or greater than the first height $H_1$. In some embodiments, a ratio of the second height $H_2$ to the first height $H_1$ is from 1 to 1.2. The two S/D regions 222a are combined and referred to a strained structure 230a. Compared with the strained structure formed by using MOCVD, the strained structure 230a has better uniformity, thereby delivering a given amount of strain into channel region of the semiconductor device 200 and enhancing the device performance.

In the second region 20b (or refers to a peripheral region), two S/D regions 222b are formed on the second germanium channel 208b and sandwiching an upper portion of the second germanium channel 208b having a length $L_b$ of the channel 208b. The two S/D regions 222b are combined and referred to a strained structure 230b. In some embodiments, the core devices (or the I/O devices) include both NMOS and PMOS. In some embodiments, both the core devices and I/O devices are p-type FETs if the strained material comprises SiGe, Ge, GeSn, SiGeSn, SiSn, or III-V material. In some embodiments, both the core devices and I/O devices are n-type FETs if the strained material comprises SiGe, Si or SiC.

Figure 3A:
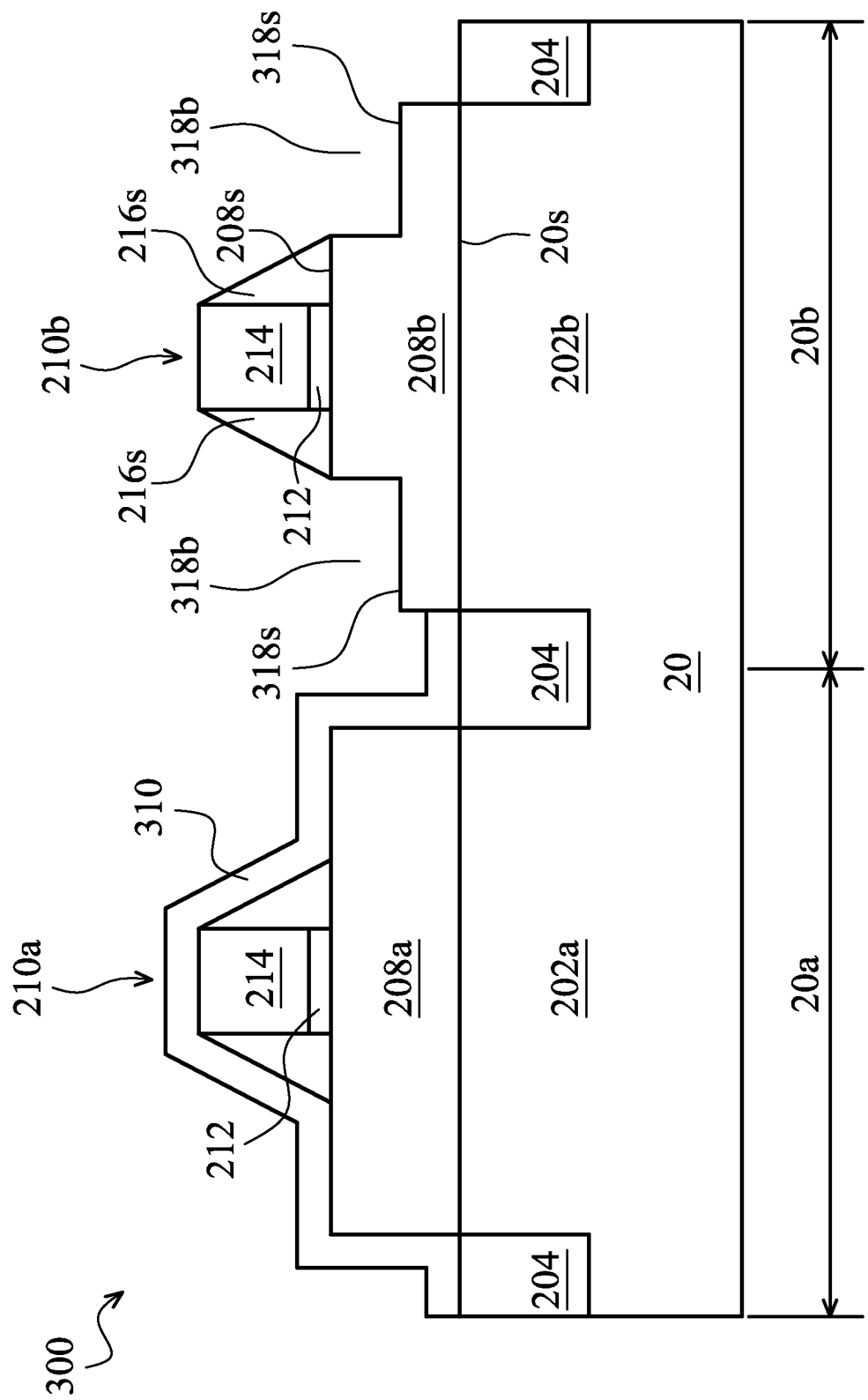
FIGS. 3A-3D are schematic cross-sectional views of another example semiconductor device comprising a strained structure at various stages of fabrication according to various aspects of the present disclosure.

In some alternative embodiments, for fabricating another embodiment of a strained structure 330 (shown in FIG. 3D) of the semiconductor device 300, the structure in FIG. 3A shows the semiconductor device 300 (200 in FIG. 2D) after recessing the second germanium channel 208b to form fourth S/D cavities 318b in the second germanium channels 208b. In the present embodiment, the semiconductor device 300 of FIGS. 3A-3D follows the formation of the semiconductor device 200 of FIG. 2D. Accordingly, similar features in FIGS. 2D and 3A-3D are numbered the same for the sake of clarity and simplicity. In the depicted embodiment, the fourth S/D cavities 318b are adjacent to the second gate stack 210b, wherein each fourth S/D cavities 318b formed by the second germanium channel 208b has a fourth surface 318s. The fourth surface 318s is between the first surface 20s and second surface 208s.

In the depicted embodiment, a dummy dielectric layer comprising a material such as silicon oxide is formed over the substrate 20 by a CVD process, and patterned to form a dummy dielectric feature 310 by proper lithography and etch methods. The patterned dummy dielectric feature 310 covers the first germanium channel 208a and exposes portions of the second germanium channel 208b (other than where the second gate stack 210b and the pair of sidewall spacers 216b are formed thereover). Then, using the patterned dummy dielectric feature 310 and the pair of sidewall spacers 216b as hard masks, a biased etching process is performed to recess the second surface 208s of the second germanium channel 208b that are unprotected or exposed to form the fourth S/D cavities 318b between the first surface 20s and the second surface 208s. In one embodiment, the etching process may be performed using a chemical selected from $NF_3$, $CF_4$, and $SF_6$ as an etching gas. In an alternative embodiment, the etching process may be performed using a solution comprising $NH_4OH$ and $H_2O_2$. In some embodiments, the step of recessing the second germanium channel 208b as depicted in FIG. 2E is skipped. In an alternative embodiment, the step of recessing the germanium channels 208a, 208b in FIG. 2E is skipped.

Figure 3B:
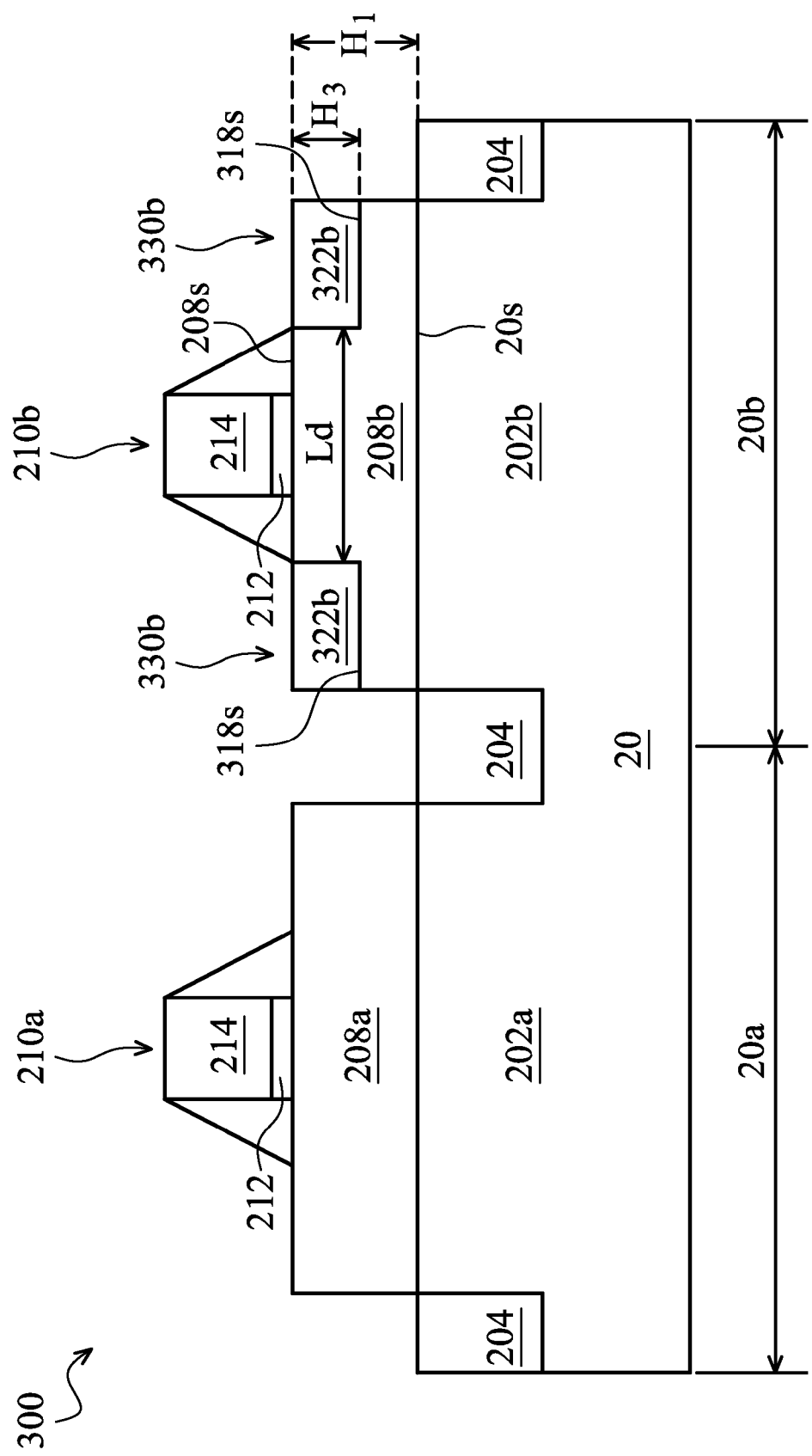

Referring to FIG. 3B, subsequent to formation of the fourth S/D cavities 318b between the first surface 20s and the second surface 208s, two S/D regions 322b are epitaxially grown on the fourth surface 318s and sandwiching an upper portion of the second germanium channel 208b having a length $L_d$ of the second germanium channel 208b. In one embodiment, a portion of the two S/D regions 322b extending downward from the second surface 208s has a third height $H_3$ less than the first height $H_1$. In another embodiment, a ratio of the third height $H_3$ to the first height $H_1$ is from 0.5 to 0.9. In the depicted embodiment, the two S/D regions 322b are combined and referred to a strained structure 330b. In some embodiments, the two S/D regions 322b comprise SiGe, Si or SiC. As such, the two S/D regions 322b in the second region 20b refer to a core region for n-type core FETs or a peripheral region for n-type I/O FETs.

In the depicted embodiment, a pre-cleaning process may be performed to clean the fourth S/D cavities 318b with HF or other suitable solution. Then, a strained material such as SiC is selectively grown by an LPCVD process to fill the fourth S/D cavities 318b. In the depicted embodiment, the LPCVD process is performed at a temperature of about 400 to 800° C. and under a pressure of about 1 to 15 Torr, using SiH$_4$, CH$_4$, and H$_2$ as reaction gases. Then the patterned dummy dielectric feature 310 is removed using HF solution.

Figure 3C:
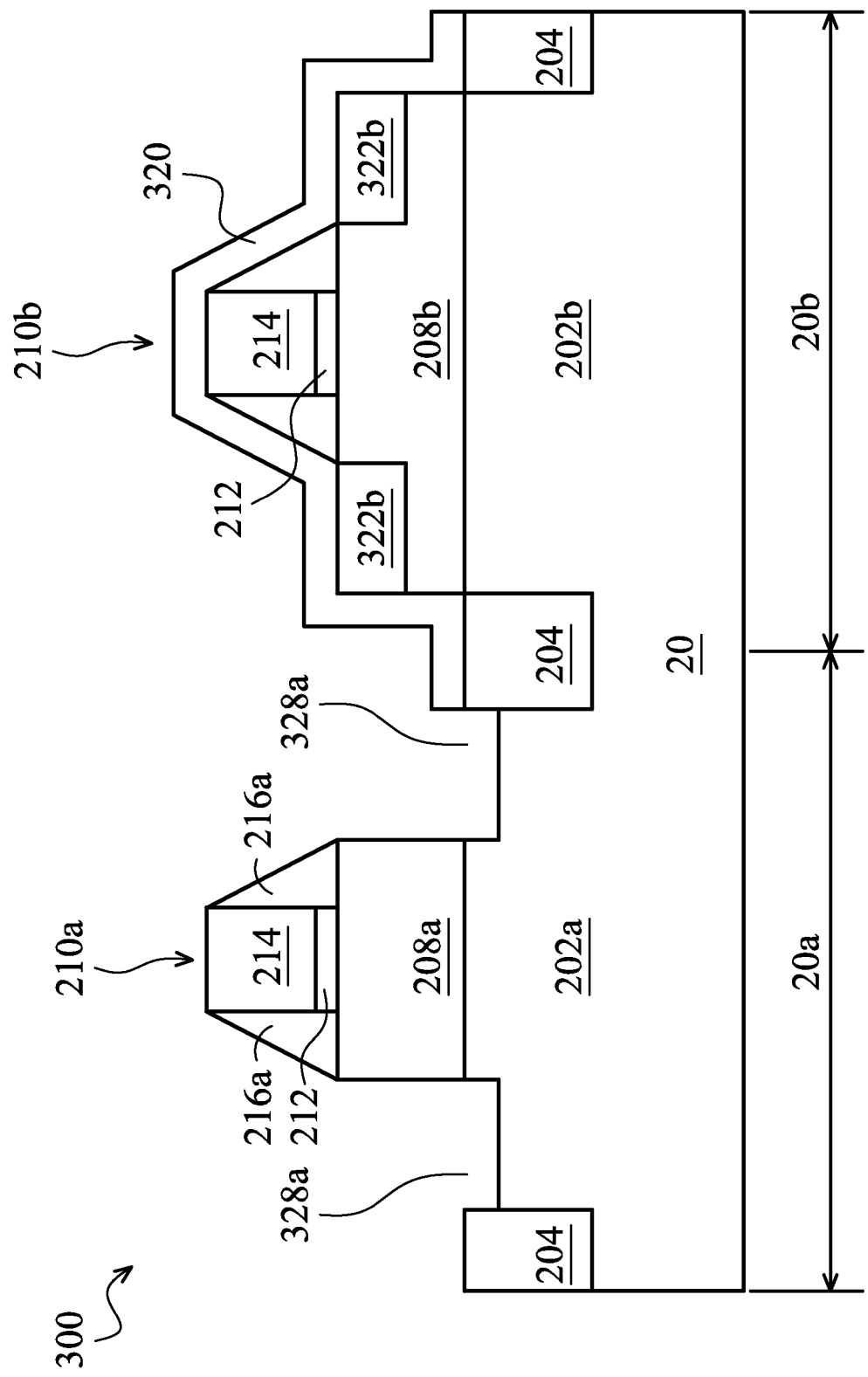

Referring to FIG. 3C and step 106 in FIG. 1, after the formation of the two S/D regions 322b on the fourth surface 318s, the structure in FIG. 3C is produced by recessing the first germanium channel 208a to form fifth S/D cavities 328a that extend through the first germanium channel 208a and into the silicon substrate 20. In the depicted embodiment, the fifth S/D cavities 328a are distributed adjacent to the first gate stack 210a.

In the depicted embodiment, a dummy dielectric layer such as silicon oxide is formed over the substrate 20 by a CVD process, and patterned to form a dummy dielectric feature 320 by proper lithography and etch methods. The patterned dummy dielectric feature 320 covers the second germanium channel 208b and exposes portions of the first germanium channel 208a (other than where the first gate stack 210a and the pair of sidewall spacers 216a are formed thereover). Then, using the patterned dummy dielectric feature 320 and the pair of sidewall spacers 216a as hard masks, a biased etching process is performed to recess the second surface 208s of the first germanium channel 208a that are unprotected or exposed to form the fifth S/D cavities 328a. In at least one embodiment, the etching process may be performed using a chemical selected from NF$_3$, CF$_4$, and SF$_6$ as an etching gas. In an alternative embodiment, the etching process may be performed using a solution comprising NH$_4$OH and/or H$_2$O$_2$.

Figure 3D:
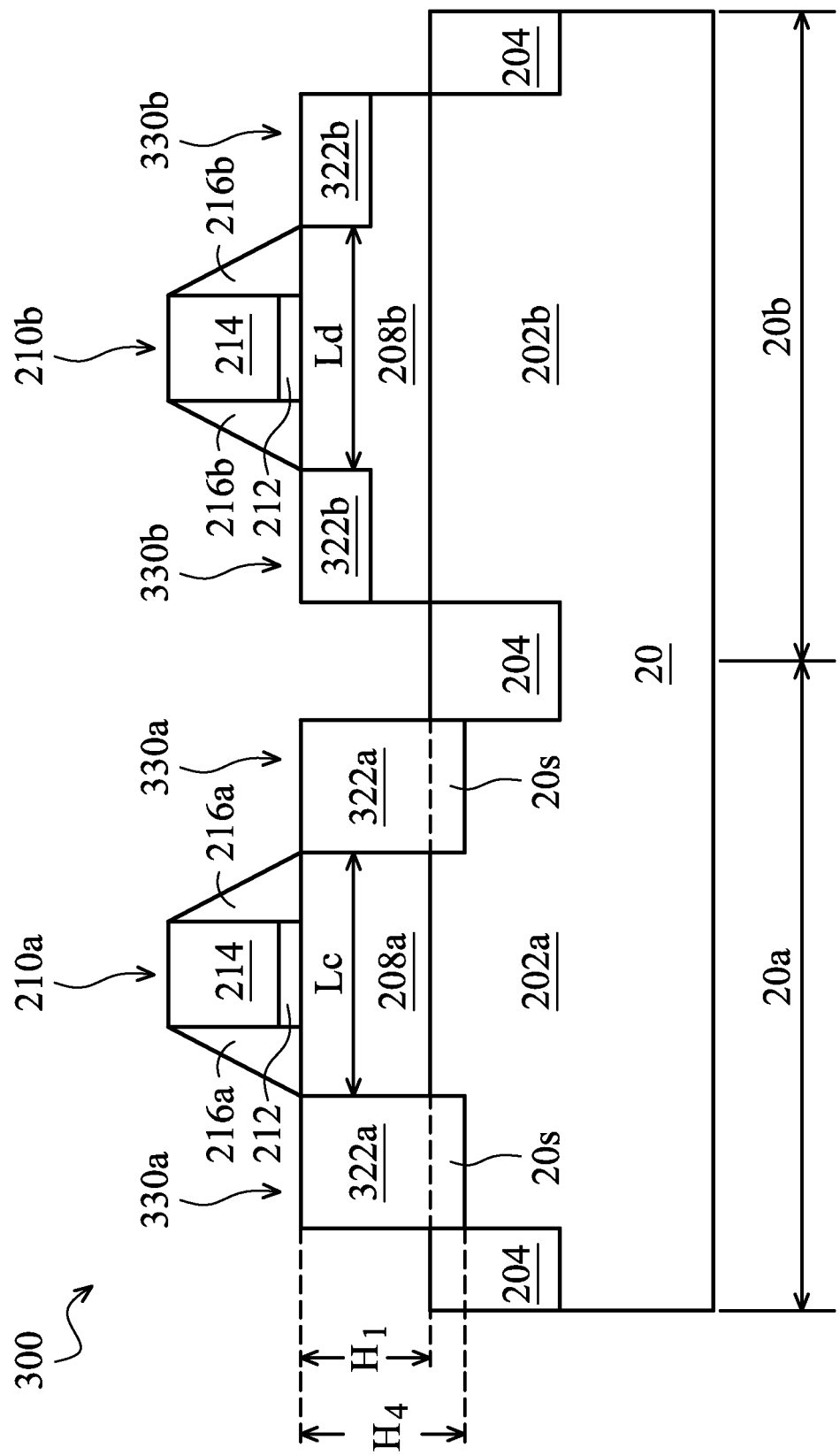

Referring to FIG. 3D and step 108 in FIG. 1, after the formation of the fifth S/D cavities 328a that extend through the first germanium channel 208a and into the silicon substrate 20, the structure in FIG. 3D is produced by epitaxially-growing a strained material in the fifth S/D cavities 328a form S/D regions 322a. The strained material may comprise SiGe, Ge, GeSn, SiGeSn, SiSn, or III-V material.

In the depicted embodiment, a pre-cleaning process may be performed to clean the fifth S/D cavities 328a with HF or other suitable solution. Then, the strained material such as silicon germanium (SiGe) is selectively grown by an LPCVD process to fill the fifth S/D cavities 328a. In one embodiment, the LPCVD process is performed at a temperature of about 660 to 700° C. and under a pressure of about 13 to 50 Torr, using SiH$_2$Cl$_2$, HCl, GeH$_4$, B$_2$H$_6$, and H$_2$ as reaction gases. In some embodiments, a ratio of a mass flow rate of the SiH$_2$Cl$_2$ to a mass flow rate of the HCl is in the range of about 0.8 to 1.5, while a ratio of a mass flow rate of the SiH$_2$Cl$_2$ to a mass flow rate of the GeH$_4$ is in the range of about 10 to 50.

In the first region 20a (or refers to a core region), two S/D regions 322a are formed on the first surface 20s (dotted line) and sandwiching an upper portion of the first germanium channel 208a having a length $L_c$ of the channel 208a. In some embodiments, the two S/D regions 322a extending downward from the second surface 208s is coplanar with the first surface 20s (dotted line). In some embodiments, the two S/D regions 322a extending downward from the second surface 208s is lower than the first surface 20s. As such, a portion of the two S/D regions 322a extending downward from the second surface 208s has a fourth height $H_4$ equal to or greater than the first height $H_1$. In some embodiments, a ratio of the fourth height $H_4$ to the first height $H_1$ is from 1 to 1.2. The two S/D regions 322a are combined and referred to a strained structure 330a. Compared with the strained structure formed by using MOCVD, the strained structure 330a has better uniformity, thereby delivering a given amount of strain into channel region of the semiconductor device 300 and enhancing the device performance.

After the steps shown in FIG. 1, as further explained in FIGS. 2A-2G or FIGS. 2A-2D and 3A-3D, have been performed, subsequent processes, comprising silicidation and interconnect processing, are typically performed to complete the semiconductor devices 200, 300 fabrications.

One aspect of this description relates to a method of fabricating a field effect transistor (FET). The method includes forming a channel portion over a first surface of a substrate, wherein the channel portion comprises germanium and defines a second surface above the first surface. The method further includes forming cavities that extend through the channel portion and into the substrate. The method further includes epitaxially-growing a strained material in the cavities, wherein the strained material comprises SiGe, Ge, Si, SiC, GeSn, SiGeSn, SiSn or a III-V material.

Another aspect of this description relates to a method of fabricating a semiconductor device. The method includes forming a channel layer over a substrate, wherein the channel layer comprises a first region and a second region, and the channel extends over the first region and the second region. The method further includes etching the channel layer over the first region of the substrate to define first cavities in the channel layer over the first region of the substrate. The method further includes etching the channel layer over the second region of the substrate to define second cavities in the channel layer over the second region of the substrate, wherein the second cavities extend into the substrate. The method further includes epitaxially-growing a strained material in the first cavities and in the second cavities, wherein the strained material comprises SiGe, Ge, Si, SiC, GeSn, SiGeSn, SiSn or a III-V material.

Still another aspect of this description relates to a method of fabricating a semiconductor device. The method includes forming a channel layer over a substrate, wherein the channel layer comprises a first region and a second region, and the channel extends over the first region and the second region. The method further includes etching the channel layer over the first region of the substrate to define first cavities in the channel layer over the first region of the substrate. The method further includes forming a protective layer over the channel layer over the first region of the substrate. The method further includes etching the channel layer over the second region of the substrate to define second cavities in the channel layer over the second region of the substrate, wherein the second cavities extend into the substrate, and the protective layer protects the channel layer over the first region of the substrate during at least a portion of etching the channel layer over the second region of the substrate. The method further includes epitaxially-growing a strained material in the first cavities and in the second cavities, wherein the strained material comprises SiGe, Ge, Si, SiC, GeSn, SiGeSn, SiSn or a III-V material.

While the invention has been described by way of example and in terms of embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a field effect transistor (FET), the method comprising:
   providing a substrate having a first composition and a first surface;
   forming a channel layer on the first surface of the substrate, wherein the channel layer has a second composition different than the first composition, wherein the channel layer includes germanium and defines a second surface above the first surface;
   forming cavities that extend from the second surface through the channel layer and through the first surface into the substrate; and
   epitaxially-growing a strained material in the cavities, wherein the strained material comprises SiGe, Ge, Si, SiC, GeSn, SiGeSn, SiSn or a III-V material.

2. The method of claim 1, wherein the step of forming a cavity is performed using a chemical selected from $NF_3$, $CF_4$, and $SF_6$ as an etching gas.

3. The method of claim 1, wherein the step of forming a cavity is performed using a solution comprising $NH_4OH$ and $H_2O_2$.

4. The method of claim 1, wherein the step of epi-growing a strained material in the cavity is performed using an LPCVD process, wherein the LPCVD process is performed at a temperature of about 660 to 700° C. and under a pressure of about 13 to 50 Torr, using $SiH_2Cl_2$, HCl, $GeH_4$, $B_2H_6$, and $H_2$ as reaction gases.

5. The method of claim 4, wherein a ratio of a mass flow rate of the $SiH_2Cl_2$ to a mass flow rate of the HCl is in the range of about 0.8 to 1.5.

6. The method of claim 4, wherein a ratio of a mass flow rate of the $SiH_2Cl_2$ to a mass flow rate of the $GeH_4$ is in the range of about 10 to 50.

7. A method of fabricating a semiconductor device, the method comprising:
   providing a substrate having a first region and a second region, wherein an isolation feature interposes the first and second regions;
   recessing the substrate in first region and in the second region;
   forming a channel layer on each of the recessed substrate of the first region and the recessed substrate of the second region;
   etching a portion of the channel layer in the first region of the substrate to define first cavities in the channel layer;
   etching the channel layer over the second region of the substrate to define second cavities in the channel layer over the second region of the substrate, wherein the second cavities extend through the channel layer and into the substrate; and
   epitaxially-growing a first strained material in the first cavities and a second strained material in the second cavities, wherein the first and second strained material each comprises one of SiGe, Ge, Si, SiC, GeSn, SiGeSn, SiSn or a III-V material.

8. The method of claim 7, wherein etching the channel layer over the second region of the substrate is performed after epitaxially-growing the strained material in the first cavities.

9. The method of claim 7, wherein epitaxially-growing the strained material in the first cavities is performed simultaneously with epitaxially-growing the strained material in the second cavities.

10. The method of claim 7, wherein etching the channel layer over the second region of the substrate is performed prior to epitaxially-growing the strained material in the first cavities.

11. The method of claim 7, wherein etching the channel layer over the second region of the substrate comprises:
   etching the channel layer over the second region of the substrate to form intermediate cavities having a depth equal to a depth of the first cavities; and
   etching the channel layer over the second region of the substrate to extend the intermediate cavities into the substrate to form the second cavities.

12. The method of claim 11, further comprising forming a protective layer over the channel layer over the first region of the substrate prior to extending the intermediate cavities into the substrate.

13. The method of claim 7, wherein etching the channel layer over the second region of the substrate comprises:
   forming a protective layer over the channel layer over the first region of the substrate, wherein the protective layer protects the channel layer over the first region of the substrate during etching the channel layer over the second region of the substrate.

14. The method of claim 7, wherein the first region of the substrate is a first fin element and wherein the second region of the substrate is a second fin, the recessing the substrate including etching the first and second fins.

15. The method of claim 7, wherein etching the channel layer over the second region of the substrate comprises:
   etching the channel layer over the second region of the substrate to form intermediate cavities simultaneously with etching the channel layer over the first region of the substrate to form the first cavities; and
   etching the channel layer over the second region of the substrate to extend the intermediate cavities into the substrate to form the second cavities.

16. A method of fabricating a semiconductor device, the method comprising:
   providing a substrate having a first fin structure and a second fin structure;
   forming a channel layer over having a first region over the first fin structure and a second region over the second fin structure;
   etching the first region of the channel layer;
   forming a protective layer over the first region of the channel layer;
   etching the second region of the channel layer to define second cavities in the channel layer over the second fin structure of the substrate, wherein the second cavities extend through the channel layer and into the substrate, and the protective layer protects the first region of the channel layer during at least a portion of etching the second region of the channel layer; and epitaxially-growing one or more strained materials in the first cavities and in the second cavities, wherein the strained material comprises SiGe, Ge, Si, SiC, GeSn, SiGeSn, SiSn or a III-V material.

17. The method of claim 16, wherein forming the protective layer comprises forming a photo-sensitive layer after initiation of etching the channel layer over the second region of the substrate.

18. The method of claim 16, further comprising forming a dielectric layer over the second region of the channel layer prior to etching the first region of the channel layer.

19. The method of claim 16, wherein the forming the channel layer to define second cavities includes epitaxially growing a second material on the first fin structure having a first material, the first material different than the second material.

20. The method of claim 16, wherein the etching the second region of the channel layer includes etching through the first material and into the second material.

* * * * *